United States Patent [19]
Miyagi

[11] Patent Number: 6,163,191
[45] Date of Patent: Dec. 19, 2000

[54] WRITING SIGNAL TIMER OUTPUT CIRCUIT WHICH INCLUDES A BISTABLE TIMER SIGNAL GENERATOR

[75] Inventor: Masanori Miyagi, Chiba, Japan

[73] Assignee: Seiko Instruments Inc., Japan

[21] Appl. No.: 09/094,969

[22] Filed: Jun. 12, 1998

[30] Foreign Application Priority Data

Jun. 13, 1997 [JP] Japan ..................... 9-157220

[51] Int. Cl.[7] .................................................. H03K 3/356
[52] U.S. Cl. .................... 327/208; 327/210; 365/225.7; 365/194
[58] Field of Search ................... 365/225.7, 194; 327/208, 210, 211, 212, 214, 263, 264, 291

[56] References Cited

U.S. PATENT DOCUMENTS

| | | | |
|---|---|---|---|
| 5,384,505 | 1/1995 | Takahashi | 327/264 |
| 5,469,100 | 11/1995 | Wuidart et al. | 327/264 |
| 5,650,739 | 7/1997 | Hui et al. | 327/263 |
| 5,936,451 | 8/1999 | Phillips et al. | 327/263 |

*Primary Examiner*—Jung Ho Kim
*Attorney, Agent, or Firm*—Adams & Wilks

[57] ABSTRACT

In a non-volatile memory capable of electrically rewriting data, a timer circuit for determining writing time that is operable at any time at a voltage of under 1.0 V. The timing circuit has a regulated voltage circuit for outputting a regulated output voltage no greater than 1.0 V, a constant current circuit for producing a constant current having a value determined by the regulated output voltage, a voltage comparing circuit for comparing an input voltage input to one terminal with a reference voltage input to another terminal, and a capacitive element connected to a constant current output terminal of the constant current circuit. A connecting point of the constant current output terminal of the constant current circuit and the capacitive element is connected as the input voltage to the voltage comparing circuit, so that a desired time period is determined by comparing a voltage to the terminal of the voltage comparing circuit connected to the capacitive element with the reference voltage connected to the other terminal of the comparing circuit.

17 Claims, 5 Drawing Sheets

$V_{TM1} > V_{TM2} > ---- > V_{TMn-1} > V_{TMn}$

WRITING SIGNAL TIMER OUTPUT CIRCUIT WHICH INCLUDES A BISTABLE TIMER SIGNAL GENERATOR

BACKGROUND OF THE INVENTION

The present invention relates to a semiconductor integrated circuit device having a trimming circuit and non-volatile memory elements, and more particularly to a semiconductor integrated circuit device capable of calibration in which the circuit device memorizes timing data in the non-volatile memory elements, then reads out the memorized data from the non-volatile memory elements, and changes an operation condition based on the read out data comprising semiconductor elements.

The present invention further relates to a semiconductor integrated circuit device capable of writing data in non-volatile elements with constant stable data writing time at a voltage range from an ultra-low voltage such as less than 1.0 V to a high voltage such as more than 3.0 V.

In the prior electrically erasable programmable read only memory (hereafter, EEPROM), the configuration shown in FIG. 4 has been used as a circuit for writing data in memory elements.

Referring to the drawing, the circuit will be described.

First a writing signal is input to a timer circuit 901.

Timing of the writing operation is controlled by the timer circuit 901.

A booster circuit 902 and an address decoder 903 operate according to the timing of the timer circuit 901, and serve to write data in a non-volatile memory array 904.

A block diagram of the prior timer circuit is shown in FIG. 5.

In the operation of the timer circuit, a capacitor is included in a constant current ciruit 1001, and in the capacitor electric charge is charged by letting a constant current determined by an output voltage of a first regulated voltage circuit 1004 flow to the capacitor.

By comparing the voltage of the capacitor with the output voltage of a second regulated voltage circuit 1003 at a voltage comparing circuit 1002 for comparing voltage, a certain constant time is obtained.

In the prior timer circuit, writing time deviates between 2 ms to 8 ms depending on deviation of circuit constants and manufacturing process. Further, depending on the threshold of a transistor included in the circuit, it is difficult to make the output of the regulated voltage circuit and reference voltage of the voltage comparing circuit less than 1.0 V with a power supply voltage of less than 1.0 V. When the power supply voltage is less 1.0 V, the output voltage of the first regulated voltage circuit 1004 and the output of the second regulated voltage circuit 1003 which operates as reference voltage of the voltage comparing circuit greatly vary with power supply voltage. Therefore, it has been difficult to maintain writing time constant.

As the output voltage of the regulated voltage circuit is near the threshold voltage of a MOS transistor when power supply voltage is less than 1.0 V, current value of the constant current circuit greatly varies with a slight deviation in voltage. Because of that, writing time has greatly varied.

SUMMARY OF THE INVENTION

To solve the above problems, the present invention has the following means.

The semiconductor integrated circuit device of a first means has means for memorizing trimming data, means for reading out the trimming data, means for enabling a change in an operation condition of the semiconductor integrated circuit device based on the trimming data (hereafter, trimming circuit), a regulated voltage circuit having an output voltage of less than 1.0 V, a constant current circuit having a constant current value determined by the output voltage of the regulated voltage circuit, a voltage comparing circuit, a capacitive element connected to a constant current output terminal of the constant current circuit, a connecting point of the constant current output terminal of the constant current circuit and the capacitive element being connected to the voltage comparing circuit, a timer circuit for determining time by comparing the voltage at the terminal of the voltage comparing circuit connected to the capacitive element with a reference voltage, the constant current circuit having a plurality of constant current transistors connected in parallel and the trimming circuit in which switching transistors are connected to each of the plurality of constant current transistors in series, wherein the switching transistors are selectively operated by the trimming data, so that the constant current value of the constant current circuit is set to a desired value by the trimming circuit, and each of the plurality of the constant current transistors connected in parallel has a different threshold voltage from the others.

As a second means, in the semiconductor integrated circuit device according to the first means, the constant current circuit of the timer circuit has a plurality of constant current transistors connected in parallel and driven by regulated voltage output of the regulated voltage circuit, the trimming circuit in which switching transistors are connected to each of the plurality of constant current transistors in series, and a current mirror circuit connected to the constant current circuit, the current mirror circuit comprising a first transistor having a drain electrode and a gate electrode connected in common and a second transistor connected so that the gate thereof and the gate of the first transistor are connected in common, the constant current transistors each having a different threshold voltage from the others being connected to the drain electrode of the first transistor, the drain electrode of the second transistor being connected to the capacitor and the constant current transistor, wherein the switching transistor operates selectively by trimming data, and the current mirror circuit in the constant current circuit charges electric charge to the capacitor with the desired constant current output by the desired constant current value of the trimming circuit.

As a third means, in the semiconductor integrated circuit device according to the first or second means, after a certain time determined in the timer circuit, the timer circuit returns to the initial condition and counts time again, output of the timer circuit is varied at a constant period, and data is written to the non-volatile memory at a timing which is an integer multiple of the original timing from the timer circuit by dividing the output.

As a fourth means, in the timer circuit of the semiconductor integrated circuit device according to the first to third means, data are written in the non-volatile memory elements at power supply voltage of 0.5 V to 1.0 V at a time which is an integer multiple of time determined in the timer circuit.

As a fifth means, in the semiconductor integrated circuit device according to the first to fourth means, trimming data for controlling the trimming circuit is stored in a redundancy part of non-volatile memory element group.

DETAILED DESCRIPTION OF THE INVENTION

Figure 1:
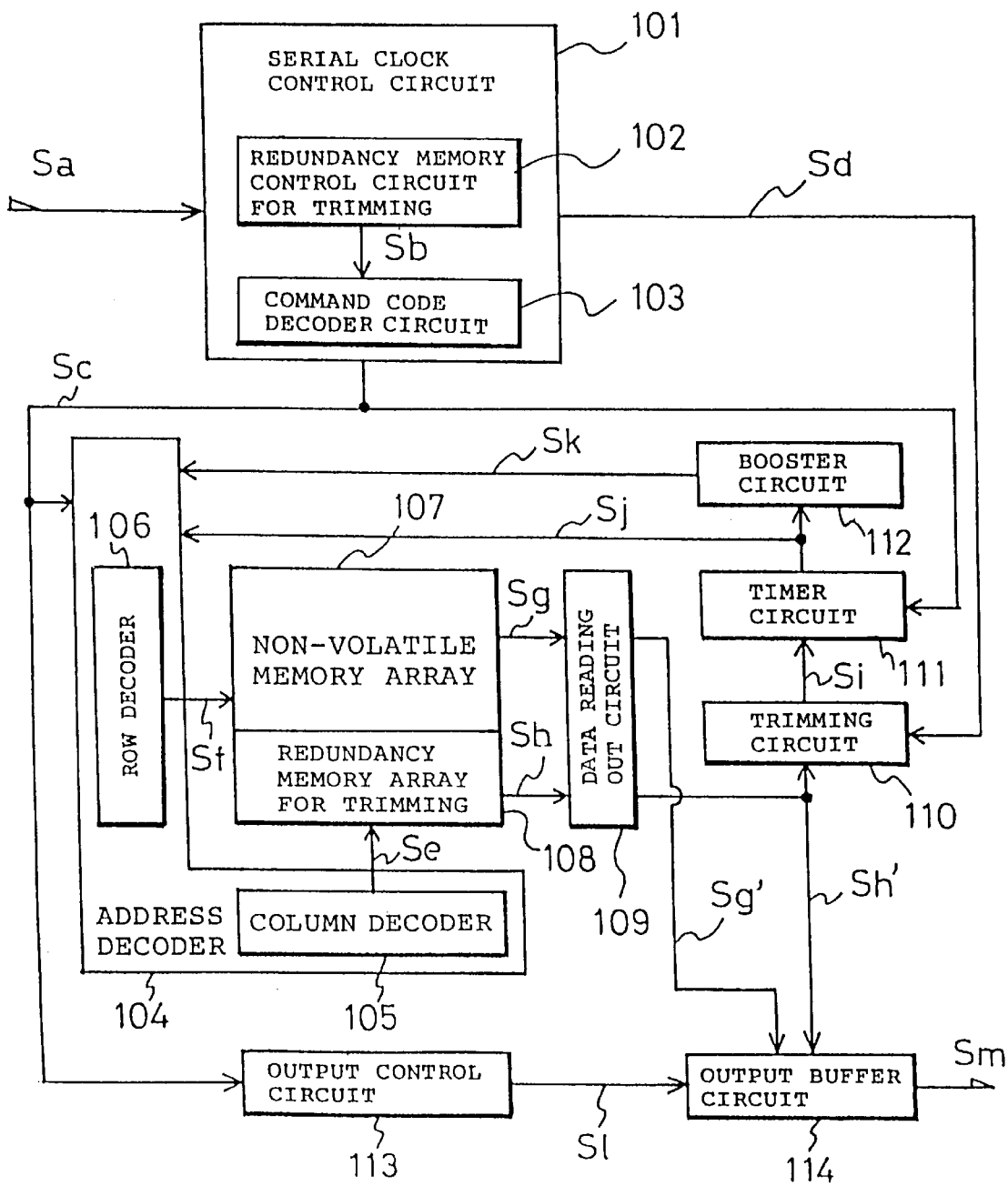
FIG. 1 is a block diagram showing an embodiment of the present invention.

As a first embodiment, means for memorizing trimming data, means for reading out the trimming data, and a trimming circuit enabling a change in an operation condition of the semiconductor integrated circuit device based on the trimming data are assembled on the semiconductor integrated circuit device. Further the circuit device has a regulated voltage circuit having an output voltage of less than 1.0 V, a constant current circuit which has a constant current value determined by the output voltage of the regulated voltage circuit therein, a voltage comparing circuit, a capacitive element connected to a constant current output terminal of the constant current circuit, a connecting point of the constant current output terminal of the constant current circuit and the capacitive element being connected to the voltage comparing circuit, a timer circuit for determining time by comparing a voltage of the capacitive element at the terminal thereof connected to the voltage comparing circuit with a reference voltage, the constant current circuit having a plurality of constant current transistors connected in parallel and the trimming circuit in which switching transistors are connected to each of the plurality of constant current transistors in series. Furthermore, in the circuit device, the switching transistors selectively operate using the trimming data, the constant current value of the constant current circuit is set to a desired value by the desired constant current value obtained by the trimming circuit, and each of the plurality of the constant current transistors connected in parallel has a different threshold voltage from the others. By this configuration, the circuit device can obtain a stable regulated voltage output even at a power supply voltage of less than 1.0 V, and a constant current value of the constant current circuit varying with circuit parameter can be charged to the capacitor with constant current value at any power supply voltage range by selectively connecting a plurality of constant current transistors which have different threshold voltages, and the reference voltage of the voltage comparing circuit can provide an accurate reference time.

As a second embodiment, in the semiconductor integrated circuit device according to the first embodiment, the constant current circuit has a plurality of constant current transistors connected in parallel and driven by the regulated voltage output of the regulated voltage circuit, the trimming circuit in which switching transistors are connected in series to each of the plurality of constant current transistors, and a current mirror circuit connected to the constant current circuit, the current mirror circuit comprising a first transistor having a drain electrode and gate electrode connected in common and a second transistor having gate and the gate of the first transistor connected in common, each of the constant current transistors having a different threshold voltage from the others and being connected to the drain electrode of the first transistor, the drain electrode of the second transistor being connected to the capacitor and the constant current transistor, wherein the switching transistor operates selectively by trimming data, and the current mirror circuit in the constant current circuit charges electric charge to the capacitor with the desired constant current output by the desired constant current value of the trimming circuit. By this configuration, electric charge can he charged to the capacitor with constant current.

As a third embodiment, in the semiconductor integrated circuit device according to the first or second embodiment, after a certain time determined in the timer circuit, the timer circuit returns to the initial condition thereof and counts time again, the output of the timer circuit is varied at a constant period, and data is written to the non-volatile memory at a time which is an integer multiple of the original time output by the timer circuit by dividing the output. By this configuration, a longer time than the original time output by the timer circuit can be easily obtained by dividing the timer circuit output to create a kind of oscillation circuit.

As a fourth embodiment, in the semiconductor integrated circuit device according to the first to third embodiments, a writing control circuit of the non-volatile semiconductor memory device is controlled at a time which is an integer multiple of the time determined in the timer circuit. By this configuration, data can he written to the non-volatile memory elements even at a power supply voltage of 0.5 V to 1.0 V in a certain time between 100 $\mu$s to 10 ms determined in the timer circuit of the third embodiment without depending on deviation of circuit parameter.

As a fifth embodiment, in the timer circuit of the semiconductor integrated circuit device according to the first to fourth embodiments, trimming data for controlling the trimming circuit is stored in a redundancy part of a non-volatile memory element group. By this configuration, time determined in the timer circuit can be freely set because trimming data is easily changed by storing trimming data in the non-volatile memory elements and the trimming data is kept without applying power supply voltage.

Referring to the drawings, embodiments of the present invention will be described.

FIG. 1 is a block diagram of a serial interface EEPROM showing the embodiment of the present invention.

In FIG. 1, the EEPROM has a non-volatile memory array 107 which operates as an actual memory array for reading and writing data during ordinary operation and a redundancy memory array 108 for memorizing trimming data, and a trimming circuit 110 is connected to a timer circuit 111 for determining data writing time to the non-volatile memory elements.

The trimming circuit 110 controls current in accordance with data of the redundancy memory array 108 for trimming.

Because of this, the trimming circuit 110 outputs a trimming signal Si for controlling the timer circuit.

Output of the timer circuit is connected to a booster circuit 112 for providing high voltage for writing and an address decoder 104 including a column decoder 105 and a row decoder 106.

Output of the booster circuit 112 is connected to the address decoder 104.

Output of the address decoder is connected to the non-volatile memory array 107 operating as an actual memory and the redundancy memory array 108 for trimming, and selects corresponding memory elements of the non-volatile memory array 107 and the redundancy memory array 108 for trimming by using the output signal Se of the column decoder 105 included therein and the output signal Sf of the row decoder 106.

In this configuration, when a serial clock control circuit 101 first recognizes a command for a writing operation, the output signal Sc of the serial clock control circuit 101 is input to the timer circuit 111 as a writing signal, and the booster circuit 112 and the address decoder 104 operate depending on timing formed in the timer circuit 111 so as to write data to the non-volatile memory array 107 and the redundancy memory array 108 for trimming.

At an entirely initial state immediately after the circuit is formed on a silicon substrate, the output signal of the timer circuit becomes non-constant because data of the redundancy memory array for trimming is non-constant, and writing time becomes insufficient to write data in the non-volatile memory elements.

Therefore, when a particular signal is input as an input signal Sa, the serial clock control circuit 101 can send directly the trimming data added from the outside to the trimming circuit 110.

Although only one input signal Sa is shown in FIG. 1, it may he plural. As the embodiment is operated in the EEPROM of the serial interface, at least a terminal in which serial clock is input, a terminal in which serial clock is input and output thereto and therefrom, and a test terminal for selecting a test mode are provided in the serial clock control circuit. When a voltage of more than the operation power supply voltage of the EEPROM such as, for example, about 12 V to 13 V, is applied to the test terminal at the predetermined timing, the serial clock control circuit 101 enters a test mode, and data received from the serial data input terminal synchronizing with serial clock is directly provided to the trimming circuit.

Figure 2:
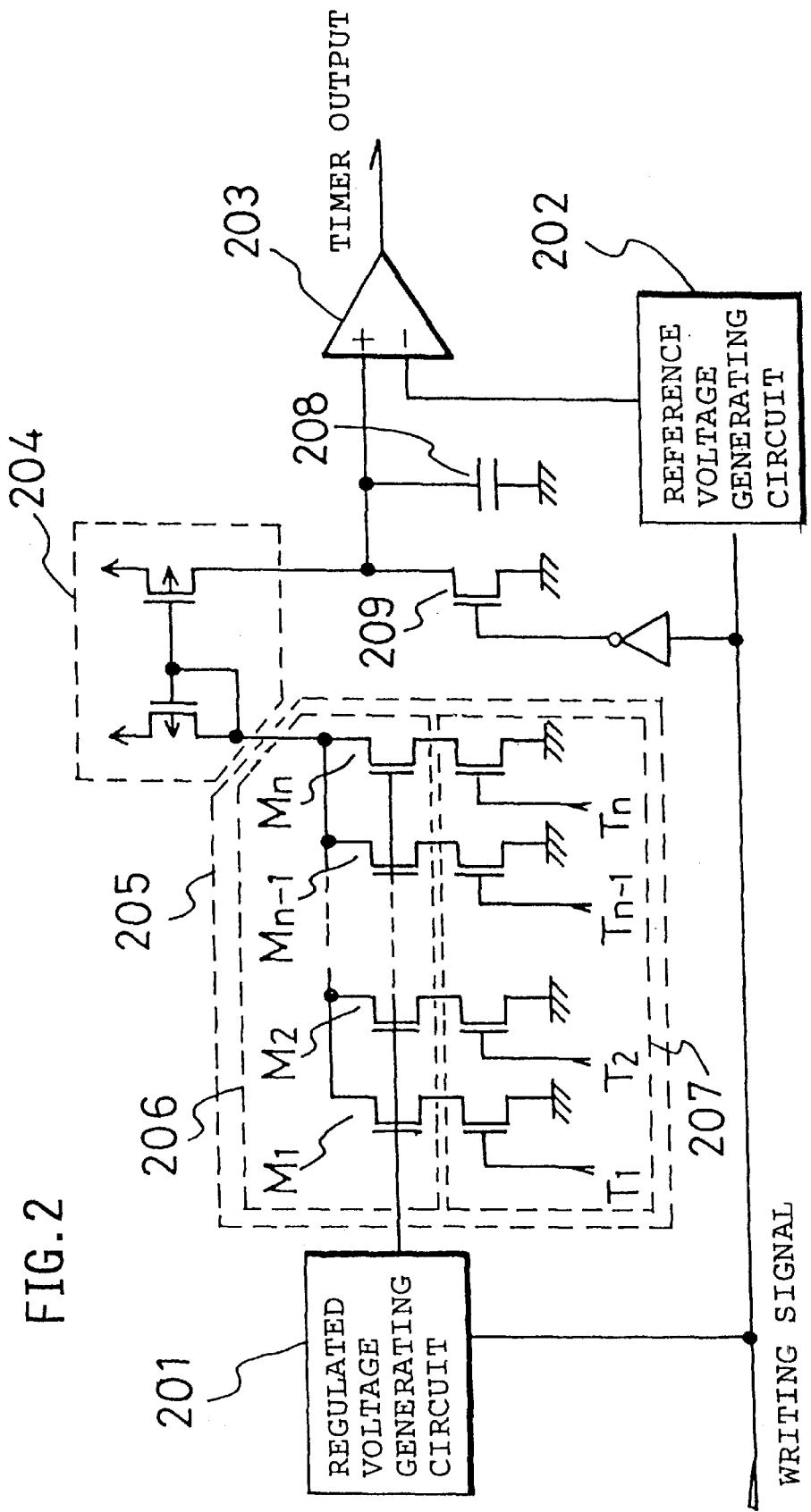
FIG. 2 is a circuit diagram showing a first embodiment of a timer circuit and a trimming circuit of the present invention.

A first embodiment of the timer circuit and the trimming circuit in the configuration of the present invention is shown in FIG. 2. A trimming circuit operating as a constant current circuit comprises a constant current transistor group 206 and a switching transistor group 207, and gate electrodes of the constant current transistor group 206 let a constant current flow upon receiving a regulated voltage output of a regulated voltage generating circuit 201.

By selecting transistors M1 to Mn using trimming data (T1 to Tn) and driving a current mirror circuit 204 at the desired constant current value, electric charge is stored to a capacitor 208 at constant current value. Then constant time is counted by comparing terminal voltage of the capacitor 208 with output voltage of the regulated voltage generating circuit in a voltage comparing circuit 203.

As the transistors M1 to Mn each have a different threshold voltage VTM1 to VTMn from the others, the current value of each is different from the others even though gate voltages thereof the are same.

To always count a constant time at different power supply voltages, the output voltage of the regulated voltage generating circuit 201 and the reference voltage generating circuit 202 are set to a smaller value than the minimum voltage of the power supply voltage range. This means that output voltage of the regulated voltage generating circuit 201 and the reference voltage generating circuit 202 should be set less than 1.0 V to stably count constant time even at a power supply voltage of 1.0 V.

When the output voltage of the regulated voltage generating circuit deviates from the desired value, the output of the regulated voltage generating circuit becomes remarkably close to threshold voltage of the constant current transistors so as to obtain sufficient current value. At that time, by selecting a transistor having a suitable threshold voltage among transistors M1 to Mn, the timer circuit can always count constant time because the trimming circuit 205 can flow constant current even if there is manufacturing deviation in threshold voltage.

In the embodiment, when writing signal becomes "H", the regulated voltage generation circuit 201 and the reference voltage generating circuit 202 starts to operate and stores electric charge in the capacitor 208. When writing start signal becomes "L", the regulated voltage generation circuit 201 and the reference voltage generating circuit 202 stop operating while electric charge of the capacitor is discharged to a transistor 209, and the timer circuit becomes placed in an initial condition by being reset.

There is a case in which the voltage comparing circuit 203 starts and stops operating by synchronizing with the writing start signal.

When the reference voltage generating circuit 202 is similar with the regulated voltage generation circuit 201, both can be united as a common regulated voltage source.

Figure 3:
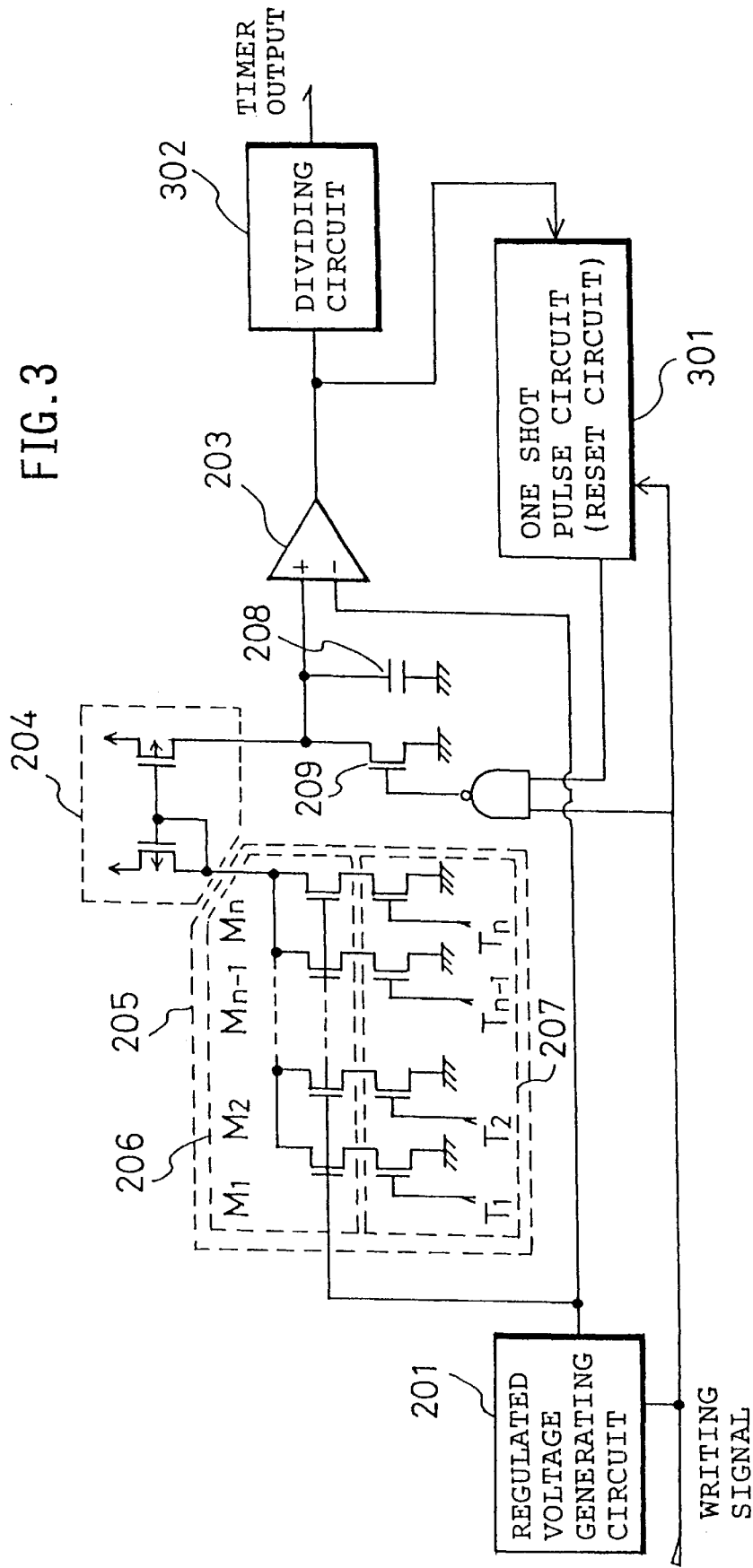
FIG. 3 is a circuit diagram showing a second embodiment of a timer circuit and a trimming circuit of the present invention.
Figure 4:
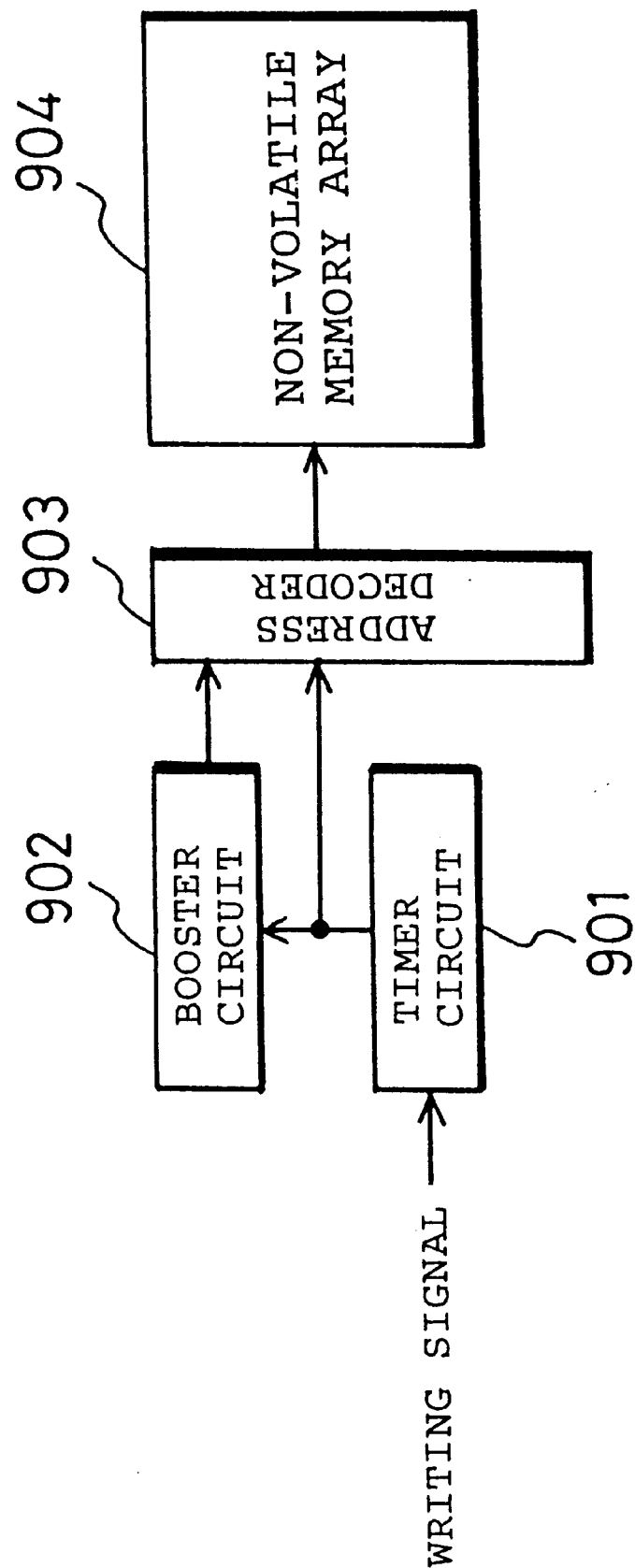
FIG. 4 is a circuit diagram showing an operation of data writing of the prior EEPROM.
Figure 5:
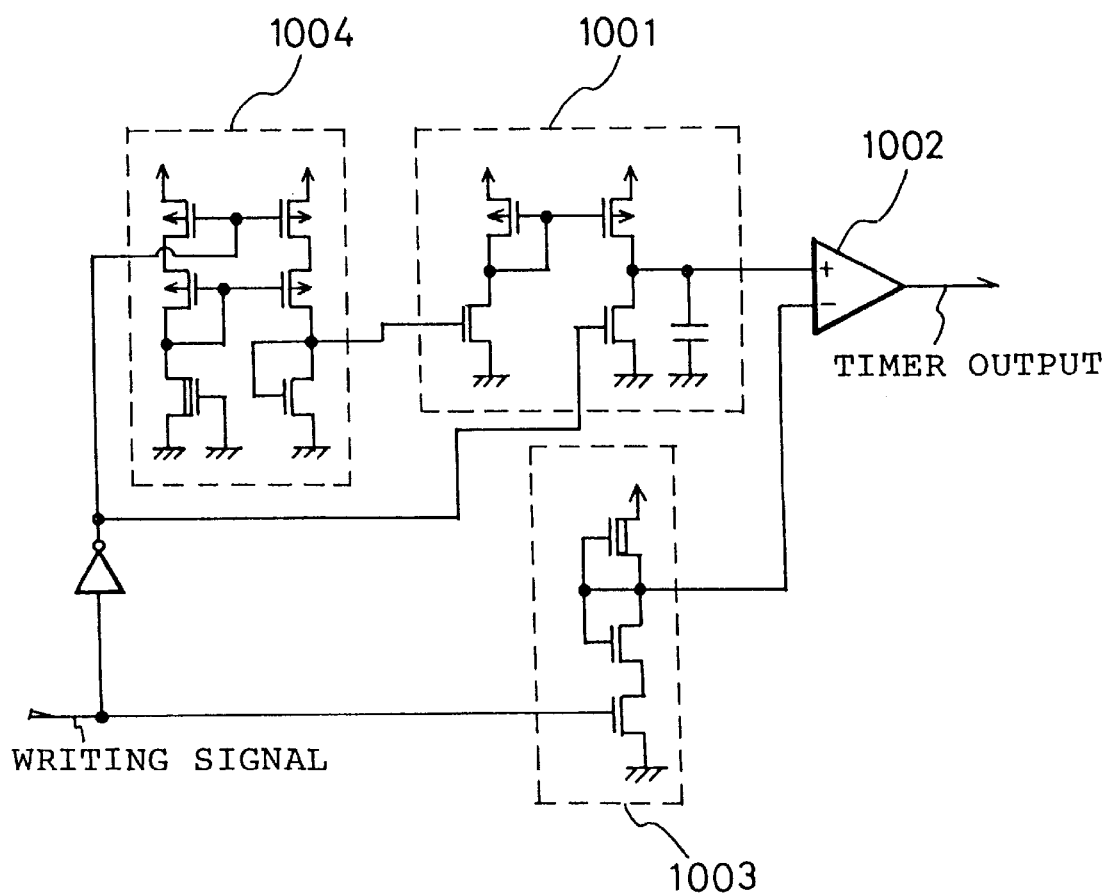
FIG. 5 is a circuit diagram showing the timer circuit of the prior EEPROM

A second embodiment of the timer circuit and the trimming circuit in the configuration of the present invention is shown in FIG. 3.

In the embodiment, a reset circuit comprising a one shot pulse circuit 301 is connected to the output of the voltage comparing circuit 203 of the timer circuit shown in FIG. 2, then after comparing the terminal voltage of the capacitor 208 and counting a constant time, electric charge of the capacitor 208 is automatically discharged by the transistor 209 so as to repeat to charge and discharge electric charge in the capacitor.

Further, by dividing the output of the voltage comparing circuit 203 by a desired time using a dividing circuit 302, a long time can easily be counted.

In the embodiment, a reference voltage generating circuit is used in common with the regulated voltage generating circuit 201.

As described above, in the present invention, a constant writing time can be freely set and secured even at a power supply voltage of less than 1.0 V by forming the trimming circuit letting constant current flow even at ultra-low voltage and redundancy memory array for trimming.

Further, by storing trimming data in the redundancy memory of the non-volatile memory, writing time can be freely set to a different value any time.

What is claimed is:

1. A semiconductor integrated circuit device having a timer circuit, the timer circuit comprising: a regulated voltage circuit for outputting a regulated output voltage no greater than 1.0 V; a constant current circuit for producing a constant current having a value determined by the regulated output voltage of the regulated voltage circuit; a voltage comparing circuit for comparing an input voltage input to one terminal thereof with a reference voltage input to another terminal thereof; and a capacitive element connected to a constant current output terminal of the constant current circuit, the connecting point of the constant current output terminal of the constant current circuit and the capacitive element being connected to apply the input voltage to the voltage comparing circuit, so that a desired time period is determined by comparing a voltage at the terminal of the voltage comparing circuit connected to the capacitive element with the reference voltage at the other terminal of the comparing circuit; wherein the constant current circuit comprises a plurality of constant current transistors connected in parallel to each other, each constant current transistor having a different threshold voltage, and a trimming circuit comprising a switching transistor connected in series to each of the plurality of constant current transistors, the switching transistors selectively operate using trimming data, the constant current value of the constant current circuit is set to a desired value by the desired constant current value obtained by the trimming circuit.

2. A semiconductor integrated circuit device according to claim 1; wherein the constant current circuit of the timer circuit has a plurality of constant current transistors connected in parallel and being driven by the regulated output voltage of the regulated voltage circuit, the trimming circuit comprising the switching transistors connected to each of the plural constant current transistors, and further comprising a current mirror circuit connected to the constant current circuit, the current mirror circuit comprising a first transistor having a drain electrode and a gate electrode connected in common and a second transistor having a gate connected to the gate of the first transistor, the constant current transistors having different threshold voltage from others being connected to the drain electrode of the first transistor, a drain electrode of the second transistor being connected to the capacitor and drain electrodes of the constant current transistors being connected to the gate of the second transistor, wherein each switching transistor operates selectively in response to the trimming data, and the current mirror circuit charges the capacitor with the constant current output having a desired constant current value set by trimming data.

3. A semiconductor integrated circuit device according to any one of claims 1 and 2; further comprising non-volatile memory elements for storing the trimming data; and a dividing circuit connected to an output of the voltage comparing circuit for controlling the writing time of trimming data to the non-volatile memory elements; wherein the trimming data is written to the non-volatile memory elements at an integer multiple of the time determined by the timer circuit by dividing the output of the voltage comparing circuit.

4. A semiconductor integral circuit device according to claim 3; wherein the trimming data is written to the non-volatile memory elements at an integer multiple of the time determined by the timer circuit at a power supply voltage within the range of about 0.5 V to 1.0 V.

5. A semiconductor integrated circuit device according to claim 4; wherein, in the timer circuit, trimming data for controlling the trimming circuit is stored in a redundancy portion of the non-volatile memory elements.

6. A semiconductor integrated circuit according to claim 1; further comprising a reset circuit for discharging the capacitive element when a level of an output of the voltage comparing circuit changes to indicate that the input voltage at the one terminal is higher in level than the reference voltage.

7. A semiconductor integrated circuit according to claim 6; wherein the reset circuit comprises a pulse generating circuit for generating a pulse in response to an output of the voltage comparing circuit, and a switch element connecting one terminal of the capacitor to ground, the switch element being closed by the pulse generated by the pulse generating circuit.

8. A semiconductor integrated circuit according to claim 1; further comprising trimming data storage means for storing the trimming data, and trimming data reading out means for reading out the trimming data from the trimming data storage means.

9. A semiconductor integrated circuit according to claim 8; wherein the trimming data storage means comprises a non-volatile memory array, and an address decoder for addressing individual non-volatile memory elements of the non-volatile memory array.

10. A semiconductor integrated circuit according to claim 1; further comprising a memory array and a boosting circuit for writing to the memory array; wherein the timer circuit is connected to an input of the boosting circuit for controlling the timing of writing data to the memory array.

11. A semiconductor integrated circuit device comprising: trimming data storage means for storing trimming data; trimming data reading out means for reading out the trimming data from the trimming data storage means; a trimming circuit for changing an operating characteristic of the semiconductor integrated circuit device in accordance with the trimming data; a regulated voltage circuit for producing a regulated output voltage; a constant current circuit for producing a constant current output signal having a constant current value determined by the output voltage of the regulated voltage circuit; a voltage comparing circuit for comparing a first voltage input with a reference voltage and producing a corresponding output signal; and a charge storage device connected to the constant current output of the constant current circuit, a connecting point of the constant current output and the charge storage device being connected as the first voltage input of the voltage comparing circuit; wherein the constant current circuit comprises a plurality of constant current transistors connected in parallel, each having a different threshold voltage, and the trimming circuit; wherein the trimming circuit comprises a switching transistor connected in series to each of the plurality of constant current transistors, the switching transistors being selectively operated by the trimming data to set the constant current value of the constant current circuit to a desired value, so that an output of the voltage comparing circuit is produced at a constant time in accordance with the trimming data.

12. A semiconductor integrated circuit device according to claim 11; wherein the regulated output voltage is no greater than 1.0 V.

13. A semiconductor integrated circuit device according to claims 11; further comprising a dividing circuit for dividing the output voltage of the voltage comparing circuit, so that trimming data may be written to the trimming data storage means at a timing which is an integer multiple of the time determined by the voltage comparing circuit.

14. A semiconductor integrated circuit device according to claim 11; wherein the trimming data is written at an integer multiple of the time determined by the voltage comparing circuit when the supply voltage of the semiconductor integrated circuit is within the range of about 0.5 V to 1.0 V.

15. A semiconductor integrated circuit device according to claim 11; wherein the trimming data storage means comprises a non-volatile memory array.

16. A semiconductor integrated circuit device according to claim 11; further comprising a current mirror circuit connected to the constant current circuit, the current mirror circuit comprising a first transistor having a drain electrode and a gate electrode connected in common and a second transistor having a gate connected to the gate of the first transistor, the constant current transistors having different threshold voltage from others being connected to the drain electrode of the first transistor, a drain electrode of the second transistor being connected to the capacitor, wherein each switching transistor operates selectively in response to the trimming data, and the current mirror circuit charges the capacitor with the constant current output having a desired constant current value set by the trimming data.

17. A timer circuit according to claim 16; wherein drain electrodes of the constant current transistors are connected to the gate of the second transistor.

\* \* \* \* \*